United States Patent [19]

Schade

[11] Patent Number: 4,772,933

[45] Date of Patent: Sep. 20, 1988

[54] METHOD FOR COMPENSATING OPERATIONALLY-INDUCED DEFECTS AND SEMICONDUCTOR DEVICE MADE THEREBY

[75] Inventor: Horst E. P. Schade, Montgomery Township, Somerset County, N.J.

[73] Assignee: General Electric Company, Schenectady, N.Y.

[21] Appl. No.: 825,590

[22] Filed: Feb. 3, 1986

[51] Int. Cl.[4] .................. H01L 29/167; H01L 29/12; H01L 27/14; H01L 45/00

[52] U.S. Cl. ........................................ 357/63; 357/58; 357/30; 357/59; 357/2

[58] Field of Search ............... 357/63, 58, 59 B, 59 C, 357/59 D, 30 J, 30 K, 2

[56] References Cited

U.S. PATENT DOCUMENTS

| | | | |
|---|---|---|---|
| 4,044,372 | 8/1977 | Weinstein | 357/30 |
| 4,064,521 | 12/1977 | Carlson | 357/2 |
| 4,366,338 | 12/1982 | Turner et al. | 357/63 |
| 4,492,810 | 1/1985 | Ovshinsky et al. | 136/255 |
| 4,501,807 | 2/1985 | Shirai et al. | 430/57 |
| 4,547,621 | 10/1985 | Hack et al. | 136/249 |
| 4,591,892 | 3/1986 | Yamazaki | 357/58 |
| 4,612,559 | 9/1986 | Hitotsuyanagi et al. | 357/63 |
| 4,681,984 | 7/1987 | Moeller | 357/59 C |

OTHER PUBLICATIONS

D. L. Staebler et al., "Reversible Conductivity Changes in Discharge-Produced Amorphous Si", Applied Physics Letters, vol. 31, No. 4, pp. 292-294, Aug. 15, 1977.

R. Street et al., "Defects in Bombarded Amorphous Silicon", Philosophical Mag. B., vol. 40, No. 6, pp. 451-464.

K. Homma et al., "Technique for Improving the Conversion Efficiency of Thin Film Amorphous Semiconductor Solar Cells", Toko Engineering College Tech., Rept. No. 29, pp. 65-82, Dec. 1981.

M. Moeller et al., "Enhanced Stability of Amorphous Silicon PIN Solar Cells by Doping Profiles", Sixth European Photovoltaic Solar Energy Conference, Apr. 15-19, 1985, London, England.

*Primary Examiner*—Martin H. Edlow
*Assistant Examiner*—Robert P. Limanek
*Attorney, Agent, or Firm*—Harry I. Steckler; James C. Davis, Jr.; Paul R. Webb, II

[57] ABSTRACT

A method for compensating operationally-induced defects in a semiconductor device which includes a semiconductor body having opposed major surfaces and having first and second region therein. The method comprises determining the thickness of the second region by the energy level of the defects relative to the equilibrium Fermi level and introducing a compensating material into the second region. In the semiconductor device the thickness of the second region extends from a major surface to a position in the body at which the energy level of the defects is about equal to the equilibrium Fermi level. The semiconductor device is typically a photodetector comprising a first layer having a first conductivity type, the first region overlies the first layer and has an intrinsic conductivity type, the second region overlies the first region and has a conductivity type opposite to that of the first layer, and a second layer overlies the second region and has the same conductivity type of the second region.

9 Claims, 1 Drawing Sheet

4,772,933

METHOD FOR COMPENSATING OPERATIONALLY-INDUCED DEFECTS AND SEMICONDUCTOR DEVICE MADE THEREBY

The invention relates to a semiconductor device and method which compensates for operationally-induced defects therein.

BACKGROUND OF THE INVENTION

The performance of semiconductor devices typically deteriorate with time. In particular, D. L. Staebler et al. in Applied Physics Letters vol. 31, No. 4, p. 292 (August 1977), disclosed that reversible changes in the photoconductivity and efficiency of an amorphous silicon solar cell occur upon exposure to light. The degradation in photoconductivity in a solar cell produced by glow discharge in a silane gas, now known as the Staebler-Wronski effect, was found to be dependent upon both the incident light intensity and the cell operating temperature. This photoconductivity degradation was reversible by heating the cell to its annealing temperature and then cooling the cell to room temperature in the dark. It has been suggested that light induced changes in the structure may act as traps or recombination centers for photogenerated charge carriers. As these traps or recombination centers degrade the efficiency of the solar cell, it would be desirable to have a semiconductor device and method for compensating such operationally-induced defects.

SUMMARY OF THE INVENTION

A method of compensating for operationally-induced defects in a semiconductor body having opposed major surfaces and having first and second regions therein, which comprises determining the thickness of the second layer by the energy level of the operationally-induced defects relative to the Fermi level, and introducing a means for compensating operationally-induced defects in the second region.

The invention also includes a semiconductor device in which the second region of the body includes a means for compensating operationally-induced defects therein and the thickness of the second region extends from a major surface of the body to a position at which the energy level of the defects is about equal to the Fermi level.

The invention further includes a photodetector comprising a first layer, a first region of substantially intrinsic conductivity type overlying the first layer, a second region overlying the first region and having a conductivity type opposite to that of the first layer, and a second layer overlying the second region having the same conductivity type of the second region.

DETAILED DESCRIPTION OF THE PREFERRED EMBODIMENTS

Figure 1:
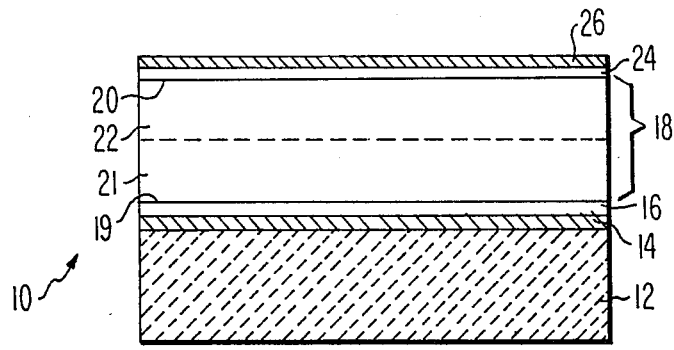
FIG. 1 is a cross-sectional view of a photodetector of the invention.

In FIG. 1, a semiconductor device 10 of the invention includes a light transmissive substrate 12, a first electrical contact 14 overlying the substrate 12 and a first semiconductor layer 16 overlying the first contact 14. A semiconductor body 18 overlies the first layer 16 and has first and second opposed major surfaces 19 and 20 and comprises first and second semiconductor regions 21 and 22, respectively. A second semiconductor layer 24 overlies the body 18 and has a conductivity type opposite to that of the first layer 16. A second electrical contact 26 overlies the second layer 24.

The substrate 12 is composed of a material, such as glass or plastic, which is substantially transparent to light and is of sufficient thickness to support the remainder of the photodetector 10. Alternatively, the second contact 26 may serve as the substrate.

The first contact 14, through which light enters the photodetector 10, is typically composed of a material which is substantially transparent to light, such as an indium-tin oxide or a thin metallic layer, and which is typically deposited using well known vacuum evaporation or sputtering techniques. The second contact 26 is typically composed of a metal such as gold, copper, silver or, preferably, a layer of titanium and a layer of aluminum sequentially deposited using vacuum evaporation or sputtering techniques.

The first layer 16 is typically composed of hydrogenated amorphous silicon (a-Si:H) or microcrystalline silicon containing a conductivity-modifying dopant in an atomic concentration of about $10^{19}$/per cubic centimeter ($cm^3$). The first layer 16 is typically between about 5 and 50 nanometers (nm) thick and is fabricated in a glow discharge containing silane and an appropriate dopant material, such as phosphorus or boron, as disclosed by Carlson in U.S. Pat. No. 4,064,521, incorporated herein by reference. The second layer 24 is typically between about 5 and 50 nm thick and is composed of a-Si:H containing a conductivity modifying dopant of the opposite conductivity type to that of the first layer 16. The dopant is typically present in an atomic concentration of about $10^{19}/cm^3$.

The body 18 is comprised of the first and the second regions 21 and 22, respectively, which are typically composed of a-Si:H. The first region 21 has substantially intrinsic type conductivity which includes undoped, compensated, or slightly n-type or p-type conducting material. The second region 22 contains a means for compensating operationally-induced defects such as a dopant in a sufficient concentration to compensate for the defects.

In a-Si:H operationally-induced defects are typically considered to be acceptor-like states, although the invention is equally applicable to donor-like states. These defects may be neutral or, alternatively, may acquire an electrically charged particle, such as an electron or a hole, and thus become operationally-induced charged defects. The second region 22 typically contains a conductivity modifying dopant of a conductivity type which will compensate for the charged defects. Thus, if the defects are negatively charged acceptor-like states, typically the second region 22 will contain an N-type conductivity dopant such as phosphorus, or if the defects are donor-like states the second region will typically contain a P-type conductivity dopant such as boron. typically, the compensating material is added during the formation of the second region 22 and the desired atomic concentration is determined experimentally.

One method of determining the appropriate concentration is through repeated experimentation by varying the dopant concentration and then measuring the photodetector efficiency after exposure to light for a predetermined time and temperature. Alternatively, an uncompensated semiconductor device may be operated for a desired period, such as by exposing an uncompensated photovoltaic cell to light for a predetermined time and temperature, and then measuring the concentration of defects by any standard method, such as electron-spin-resonance, thus determining an appropriate compensator concentration to be introduced into the device. Typically the concentration of defects after illumination is about $10^{19}/cm^3$ and thus the compensator concentration is between about $10^{16}/cm^3$ and $10^{18}/cm^3$.

Figure 2:
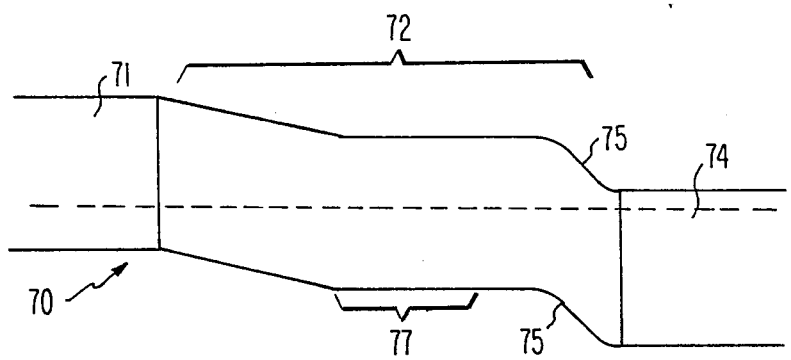
FIG. 2 is an energy band diagram of an uncompensated photodetector having light induced defects therein.

The body 18 is typically between about 500 and 1000 nm thick and the thicknesses of the first and second regions 21 and 22, respectively, extend from the major surfaces 19 and 20, to a position in the body 18 at which the energy level of the defects is about equal to the equilibrium Fermi level $E_f$. As shown in FIG. 2, in an energy band diagram 70 representing an uncompensated PIN photodetector which has a P-type region 71, an intrinsic region 72, and an N-type region 74, increased band-bending 75 will typically occur adjacent the N-type region 74 if acceptor-like defects are present in that portion of the semiconductor body. This band-bending is created when the energy level of the acceptor-like defect centers is below $E_f$ and electrons are trapped, resulting in an increase in the negative space charge adjacent the N-type layer. The increase in local space charge results in a leveling out of the energy bands towards the middle of the intrinsic type region 72. The leveling out of the energy bands signifies a reduction in the electric field thereby forming a field free dead zone 77 in the semiconductor body. As the field free zone 77 is created due to the band-bending 75 adjacent the N-type region 74, the compensating second region should be contiguous with the N-type layer. Introducing a compensating material over the thickness of the body which extends from a major surface of the body to a position at which the energy level of the defects is about equal to the equilibrium Fermi level compensates for the undesirable effects caused by band-bending. Thus, for a P-I-N photodetector if the defects are donor-like and band bending occurs adjacent the P-type region as determined for example, by surface photovoltage techniques, the thickness of the second region is about equal to the thickness over the portion of the body in which the energy level of the defects is above the equilibrium Fermi level and a P-P-I-N device is formed. Alternatively, if the defects are acceptor-like and band-bending occurs adjacent the N-type region, the thickness of the second region is about equal to the thickness over the portion of the body in which the energy level of the defects is below the equilibrium Fermi level and a P-I-N-N device is formed.

Figure 3:
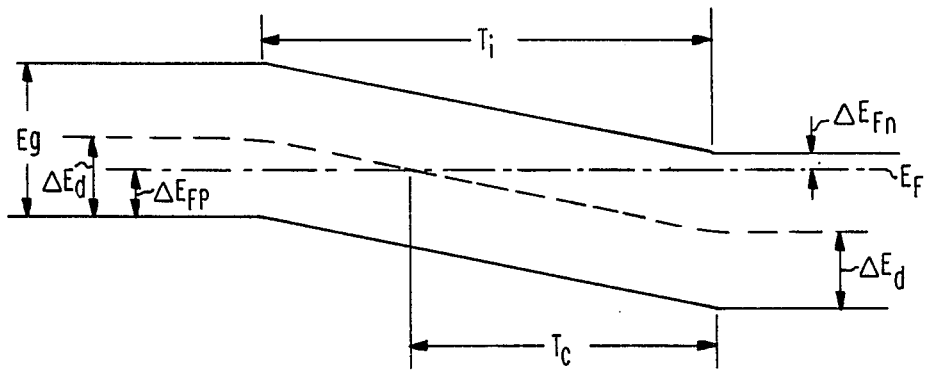
FIG. 3 is an energy band diagram of a photodetector of the invention having light induced defects therein.

In FIG. 3 for a PIN photodetector, $\Delta E_d$ denotes the energy difference between acceptor-like operationally-induced defects and the valence band, $E_g$ is the energy gap, $\Delta E_{fp}$ is the energy difference between the valence band of the P-type first layer 16 and $E_f$, $\Delta E_{fn}$ is the energy difference between the conduction band of the N-type second layer 24 and $E_f$, $T_i$ denotes the thickness of the intrinsic conductivity type semiconductor body and $T_c$ denotes the thickness of the second region which is to be compensated. $\Delta E_{fp}$ and $\Delta E_{fn}$ may be determined by any well-known technique such as the temperature dependence of the electrical conductivity. For a standard PIN photodetector $T_c$ may be determined from:

$$T_c = \frac{E_g - \Delta E_d - \Delta E_{fn}}{E_g - \Delta E_{fp} - \Delta E_{fn}} T_i$$

Accordingly, it should be understood that in FIG. 1, the relative positions of the first and second regions 21 and 22, respectively, are dependent upon the position of the band-bending resulting from the position and type of defect centers. The concentration of the compensating material may be varied within the second region to compensate for variations in the local space charge.

It should be understood that the principles of the invention may be applied to other semiconductor devices having operationally-induced defects.

I claim:

1. In a semiconductor device comprising a semiconductor body having a plurality of operationally-induced defects therein, said body having opposed major surfaces and including a first region and a second region, wherein the improvement comprises:
    said second region having a means for compensating said defects therein and extending from a major surface to a position in the body at which the energy level of the defects is about equal to the equilibrium Fermi level in said body and said first region extending from opposed major surface to said position in the body at which the energy level of the defects is about equal to the equilibrium Fermi level in said body and said first region being substantially absent of said means for compensating defects.

2. The device of claim 1, wherein said defects are acceptor-like states.

3. The device of claim 2, wherein the thickness of said second region is about equal to the thickness of the portion of the body in which the energy level of the acceptor-like states is below said Fermi level.

4. The device of claim 1, wherein said defects are donor-like states.

5. The device of claim 4, wherein the thickness of said second region is about equal to the thickness of the portion of the body in which the energy level of the donor-like states is above said Fermi level.

6. The device of claim 1, wherein said device is a photodetector and said body has a first semiconductor layer thereon through which light enters the body and a second semiconductor layer on a surface thereof opposite said first layer.

7. The device of claim 6, wherein said first layer has P-type conductivity, said first region has substantially intrinsic conductivity type and is contiguous with said first layer, said second region has N-type conductivity and overlies said first region, and said second layer has N-type conductivity and overlies said second region.

8. The device of claim 6, wherein said first layer has N-type conductivity, said first region has substantially intrinsic conductivity type and is contiguous with said first layer, said second region has P-type conductivity and overlies said first region, and said second layer has P-type conductivity and overlies said second region.

9. A device for receiving radiation and producing an output comprising:
    a first semiconductor layer of a first conductivity type;
    a semiconductor body having operationally induced defects and having opposed major surfaces and having a first region of a substantially intrinsic conductivity type overlying said first layer, and a second region having a conductivity type opposite to that of said first layer overlying said first region, wherein the thickness of said second region extends from a major surface of said body to a position at which the energy level of the defects is about equal to the Fermi level of said body;

a second semiconductor layer overlying said second region and having the same conductivity type of said second region; and a means for electrically contacting said first and second layers.

* * * * *